(12) United States Patent
Barbot et al.

(10) Patent No.: US 11,984,527 B2
(45) Date of Patent: May 14, 2024

(54) METHOD FOR MANUFACTURING A PHOTOVOLTAIC MODULE

(71) Applicant: COMMISSARIAT A L'ENERGIE ATOMIQUE ET AUX ENERGIES ALTERNATIVES, Paris (FR)

(72) Inventors: Anthony Barbot, Grenoble (FR); Yannick Roujol, Grenoble (FR); Caroline Seraine, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 522 days.

(21) Appl. No.: 17/312,687

(22) PCT Filed: Dec. 11, 2019

(86) PCT No.: PCT/FR2019/053026
§ 371 (c)(1),
(2) Date: Jun. 10, 2021

(87) PCT Pub. No.: WO2020/120098
PCT Pub. Date: Jun. 18, 2020

(65) Prior Publication Data
US 2022/0069155 A1 Mar. 3, 2022

(30) Foreign Application Priority Data
Dec. 13, 2018 (FR) ..................................... 18 72850

(51) Int. Cl.
*H01L 31/18* (2006.01)
*H01L 31/0392* (2006.01)
*H01L 31/048* (2014.01)

(52) U.S. Cl.
CPC ........ *H01L 31/18* (2013.01); *H01L 31/03926* (2013.01); *H01L 31/0481* (2013.01)

(58) Field of Classification Search
CPC ............... H01L 31/18; H01L 31/03926; H01L 31/0481; H01L 31/048; Y02E 10/50
(Continued)

(56) References Cited

U.S. PATENT DOCUMENTS

| 4,057,439 A | 11/1977 | Lindmayer |
| 4,093,473 A | 6/1978 | Lindmayer |
| 2014/0096825 A1* | 4/2014 | Bonekamp ............ B32B 27/327 156/182 |

FOREIGN PATENT DOCUMENTS

JP 2013-235932 A 11/2013

OTHER PUBLICATIONS

International Search Report dated Mar. 23, 2020 in PCT/FR2019/053026 filed on Dec. 11, 2019, 2 pages.

\* cited by examiner

*Primary Examiner* — Jami Valentine Miller
*Assistant Examiner* — Shawn Shaw Muslim
(74) *Attorney, Agent, or Firm* — Oblon, McClelland, Maier & Neustadt, L.L.P.

(57) ABSTRACT

A method for manufacturing a photovoltaic module having at least one photovoltaic cell includes a step of encapsulating the photovoltaic cell including the formation of a stack having the photovoltaic cell; an encapsulation film based on a polymer material cross-linked at least at its freezing point; and an adhesion layer based on a crosslinkable polymer material. The adhesion layer is configured to adhere the encapsulation film to the photovoltaic cell. The manufacturing method also includes a cross-linking step including cross-linking the crosslinkable polymer material of the adhesion layer.

13 Claims, 5 Drawing Sheets

(58) Field of Classification Search
USPC .......................................................... 438/64
See application file for complete search history.

METHOD FOR MANUFACTURING A PHOTOVOLTAIC MODULE

TECHNICAL FIELD OF THE INVENTION

The technical field of the invention relates to the field of photovoltaics, and relates in particular to photovoltaic modules. In particular, the invention relates to a method for manufacturing a photovoltaic module.

PRIOR ART

In order to protect the photovoltaic cells of a photovoltaic module, it is conventional practice to encapsulate them. The encapsulation of photovoltaic cells makes it possible, for example, to protect them from rain, wind, snow, moisture and ultraviolet radiation.

For this, it is known practice to form a stack successively comprising: a back protective element, a film of ethylene-vinyl acetate (EVA), photovoltaic cells electrically connected to one another, a film of ethylene-vinyl acetate (EVA), and a front protective element such as for example a glass plate. The front protective element is intended to receive the solar radiation before this radiation interacts with the photovoltaic cells to generate electrical energy. This stack is then hot-laminated in order to melt the EVA films and cause the crosslinking of the molten EVA, resulting in the formation of a solid encapsulation envelope for the photovoltaic cells which is bonded to the front and back protective elements. The use of EVA has the advantage of facilitating the manufacture of a photovoltaic module via hot lamination of the stack. However, EVA has the drawback of generating acetic acid as it is crosslinked during lamination, this acetic acid corroding the electrodes of the photovoltaic cells. EVA also has the drawback of yellowing over time due to its exposure to ultraviolet radiation. Furthermore, EVA has the drawback of being associated with a narrow range of usage temperatures which makes its use incompatible with a space environment.

U.S. Pat. No. 4,057,439 describes an encapsulation solution based on silicone. The problem with this solution is that it implements liquid-based encapsulation which may generate gas bubbles, in particular air bubbles, within the encapsulant and makes it difficult to control the thickness of the encapsulant. The gas bubbles may cause the photovoltaic module to burst when it is deployed out of the Earth's atmosphere in a space application due to a difference in pressure between the gas bubbles and the outside of the photovoltaic module. For a terrestrial application, the presence of bubbles is also harmful because beyond simple esthetic issues, the bubbles may result in poorer transmission of solar radiation to the photovoltaic cells if these bubbles are formed above the photovoltaic cells (the solar radiation may then be partly reflected). Moreover, bubbles may also result in poorer dissipation of heat from the photovoltaic module, which may thus immediately cause the photovoltaic cells to lose efficiency. Another drawback of the presence of bubbles is that they may eventually promote delamination of the photovoltaic module.

Document JP 2013 235932 A, relating to a method for encapsulating photovoltaic cells with silicone resin, is known.

SUBJECT OF THE INVENTION

The subject of the invention is a method for manufacturing a photovoltaic module which makes it possible in particular to improve the encapsulation of a photovoltaic cell of this photovoltaic module by limiting the formation of gas bubbles during the encapsulation of the photovoltaic cell and/or by facilitating control of the thickness of the encapsulant of the photovoltaic cell.

To that end, the invention relates to a method for manufacturing a photovoltaic module comprising at least one photovoltaic cell, this manufacturing method being characterized in that it comprises a step of encapsulating the photovoltaic cell comprising the formation of a stack comprising:

the photovoltaic cell,
an encapsulation film based on a polymer material crosslinked at least at its gel point,
an adhesion layer based on a crosslinkable polymer material, the adhesion layer being intended to bond the encapsulation film to the photovoltaic cell,
and the manufacturing method comprises a crosslinking step comprising the crosslinking of the crosslinkable polymer material of the adhesion layer.

One advantage of such a manufacturing method lies in the use of an encapsulation film that is crosslinked at least at its gel point, thus making it possible to limit the amount of crosslinkable product, in particular in the liquid state, to be used so as to limit the formation of gas bubbles during encapsulation. Moreover, since the encapsulation film is crosslinked at least at its gel point, it will not melt during the manufacturing method, which allows better control of ultimate encapsulant thickness within the photovoltaic module, and which makes it possible to prevent the formation of new gas bubbles within this encapsulation film since it will not change state (solid to liquid) during manufacture. Specifically, the change of state from solid to liquid and then back to solid may lead to the presence of gas bubbles if the method, for example lamination, is not properly optimized.

The manufacturing method may further comprise one or more of the following features:

the manufacturing method comprises a step of forming the adhesion layer on the encapsulation film before bringing the adhesion layer into contact with the photovoltaic cell;

the polymer material crosslinked at least at its gel point of the encapsulation film and the crosslinkable polymer material of the adhesion layer are respectively chosen from among the silicone family;

the encapsulation step comprises a step of laminating the stack implementing the crosslinking step;

the formation of the stack is such that said stack comprises: a first part comprising said encapsulation film and said adhesion layer; a second part comprising an additional encapsulation film based on a polymer material crosslinked at least at its gel point and an additional adhesion layer based on a crosslinkable polymer material intended to bond the additional encapsulation film to the photovoltaic cell; the photovoltaic cell interposed between the first and second parts; and the crosslinking step comprises the crosslinking of the crosslinkable polymer material of the additional adhesion layer, the crosslinking step resulting in the encapsulation of the photovoltaic cell between the encapsulation film and the additional encapsulation film;

the formation of the stack is such that the stack comprises first and second protective elements between which the first and second parts of the stack are arranged, the first part of the stack comprising a bonding layer based on a crosslinkable polymer material intended to bond the encapsulation film to the first protective element, and the second part comprising an additional bonding layer based on a crosslinkable polymer material intended to bond the additional encapsulation film to the second protective element, and the crosslinking step comprises the crosslinking of the crosslinkable polymer material of the bonding layer and of the crosslinkable polymer material of the additional bonding layer such that the crosslinking step results in the formation of an encapsulation envelope for the photovoltaic cell bonded to the first and second protective elements;

the encapsulation film and the additional encapsulation film are perforated such that within the stack: the adhesion and bonding layers are connected to one another at the holes in the encapsulation film, in particular by crosslinkable polymer material present in said holes; the additional adhesion and bonding layers are connected to one another at the holes in the additional encapsulation film, in particular by crosslinkable polymer material present in said holes;

at least one of the first and second protective elements is deformable such that it undergoes deformation during the lamination step;

after the lamination step, the manufacturing method comprises a step of bonding a support to the deformed first protective element or to the deformed second protective element;

the formation of the stack comprises: a step of providing a flexible substrate comprising at least one portion impregnated with crosslinkable polymer material; a step of bringing a back face of the photovoltaic cell into contact with the impregnated portion, the back face being opposite a front face of the photovoltaic cell, said front face being in contact with the adhesion layer within the stack, and the crosslinking step comprises the crosslinking of the crosslinkable polymer material impregnating the substrate resulting in the encapsulation of the photovoltaic cell;

the viscosity of the crosslinkable polymer material of the adhesion layer is strictly higher than 5 Pa·s at a temperature of 25° C. and lower than or equal to 50 Pa·s at a temperature of 25° C.;

the viscosity of the crosslinkable polymer material of the adhesion layer is strictly higher than 5 Pa·s at a temperature of 25° C. and lower than or equal to 10 Pa·s at a temperature of 25° C.

The invention also relates to a photovoltaic module comprising a stack, the stack comprising at least one photovoltaic cell, this photovoltaic module being characterized in that the stack comprises a bilayer formed by an encapsulation film based on a crosslinked polymer material and an adhesion layer based on a crosslinked polymer material, the adhesion layer being arranged between said encapsulation film and the photovoltaic cell, the adhesion layer bonding said encapsulation film to the photovoltaic cell.

In particular, the photovoltaic module may comprise a flexible substrate bonded to a back face of the photovoltaic cell by crosslinked polymer material in at least a portion of the substrate, and the photovoltaic cell comprises a front face in contact with the adhesion layer.

According to one particular embodiment of the photovoltaic module, the stack comprises:
a first protective element,
a bonding layer based on a crosslinked polymer material, said bonding layer bonding the encapsulation film to the first protective element,
an additional adhesion layer based on a crosslinked polymer material,
an additional encapsulation film based on a crosslinked polymer material, the additional encapsulation film being bonded to the photovoltaic cell by the additional adhesion layer,
an additional bonding layer based on a crosslinked polymer material,
a second protective element bonded to the additional encapsulation film by the additional bonding layer.

Advantageously, the encapsulation film and the additional encapsulation film may be perforated such that:
the adhesion and bonding layers are connected to one another at the holes in the encapsulation film, in particular by crosslinked polymer material present in said holes,
the additional adhesion and bonding layers are connected to one another at the holes in the additional encapsulation film, in particular by crosslinked polymer material present in said holes.

Other advantages and features relating to the invention will become clearly apparent from the following detailed description.

BRIEF DESCRIPTION OF THE DRAWINGS

The invention will be better understood from reading the following detailed description, given solely by way of non-limiting example and with reference to the accompanying drawings, which are listed below.

In these figures, the same references are used to refer to identical elements.

DETAILED DESCRIPTION

Figure 1:
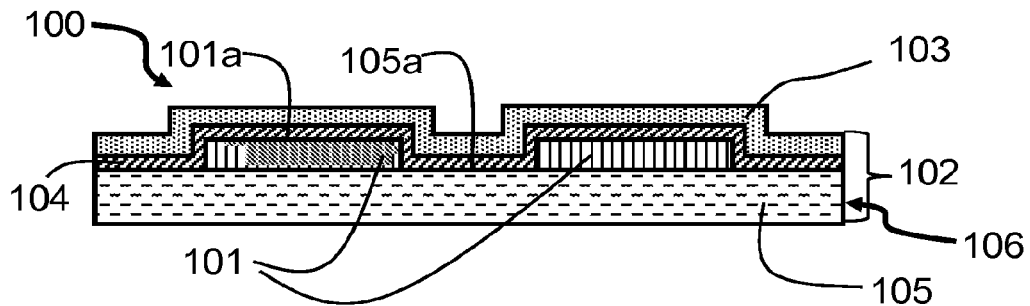
FIG. 1 shows a sectional view of a photovoltaic module formed by implementing a method for manufacturing a photovoltaic module according to a first embodiment of the invention.

In the present description, a value comprised between two limits is understood as including those limits.

Conventionally, a photovoltaic cell has two opposite faces, respectively called the front face and the back face. The front face of the photovoltaic cell is called the "active" face, i.e. the face configured to receive radiation, in particular from the sun, to be converted into electrical energy. Typically, the photovoltaic cell of the photovoltaic module described below may have a thickness of between 10 micrometers and 300 micrometers.

A photovoltaic module within the meaning of the present description comprises at least one photovoltaic cell which is encapsulated in order to protect it.

In the present description, the term "transparent" means transparent to the radiation, in particular from the sun, that the photovoltaic cell can use to generate electrical energy. The transparency is therefore adapted according to the application and is sufficient to allow photovoltaic conversion by the photovoltaic cell. In particular, each encapsulation film (whether additional or not) described below is transparent, and each adhesion layer (whether additional or not) or bonding layer (whether additional or not) described below, the polymer material of which is in its crosslinked state, is transparent, where applicable, to allow the radiation, in particular from the sun, to reach the front face of the photovoltaic cell.

In the present description, when an element is deformable, this element may be deformed during lamination which will be described in more detail below.

In the present description, when an element is rigid, what is meant is that it does not deform, in particular during lamination implemented in the manufacturing method.

In the present description, what is meant by "based on" is in particular "at least mostly comprises". As such, in the context of "an element based on a material", "based on" may also mean "consists of", and in this case the material in question is the only one included in the composition of said element.

The invention relates to a method for manufacturing a photovoltaic module 100 comprising at least one photovoltaic cell 101. Steps of such a manufacturing method or, where applicable, products obtained by this manufacturing method according to various embodiments are shown in FIGS. 1 to 20.

Hereinafter, what is understood by "at least one photovoltaic cell 101" is that if the photovoltaic module 100 comprises a plurality thereof, everything that applies to the photovoltaic cell 101 may be applied to each of the photovoltaic cells 101. For example, FIGS. 1 to 4, 6 to 9, 11 to 16 and 19 to 20 show two photovoltaic cells 101. As such, "the photovoltaic cell 101" refers hereinafter to "said at least one photovoltaic cell 101".

In general, the method for manufacturing the photovoltaic module 101 comprises a step of encapsulating the photovoltaic cell 101. This encapsulation step comprises the formation of a stack 102 (visible in particular in FIGS. 1 to 3, 6, 8, 11 to 16, 19 and 20) with a view to encapsulating the photovoltaic cell 101. The formation of the stack 102 is such that said stack 102 comprises:

- the photovoltaic cell 101, also called the "photovoltaic cell 101 to be encapsulated",
- an encapsulation film 103 based on a polymer material crosslinked at least at its gel point, the encapsulation film 103 possibly consisting of the crosslinked polymer material,
- an adhesion layer 104 based on a crosslinkable polymer material, the adhesion layer 104 being intended to bond the encapsulation film 103 to the photovoltaic cell 101, the adhesion layer 104 preferably consisting of the crosslinkable polymer material.

The encapsulation film 103 is also called the encapsulation film for the photovoltaic cell 101. The encapsulation film 103 is preferably deformable. In particular, within the stack 102, the adhesion layer 104 is in contact, on the one hand, with the encapsulation film 103 and, on the other hand, with the photovoltaic cell 101 and more particularly with one of the two (front or back) faces of the photovoltaic cell 101.

As mentioned above, the stack 102 may comprise a plurality of photovoltaic cells 101. As such, when the stack 102 comprises a plurality of photovoltaic cells 101, everything that applies to the photovoltaic cell 101 may be applied to each of the photovoltaic cells, and these photovoltaic cells 101, which are called "coplanar" photovoltaic cells, are preferably connected to one another (i.e. electrically connected), and these photovoltaic cells are in particular bonded to the encapsulation film 103 by the same adhesion layer 104.

As will be described in more detail below, the stack 102 may also comprise an additional encapsulation film, an additional adhesion layer and, where applicable, a bonding layer and an additional bonding layer. In particular, what applies to the features of the adhesion layer (e.g. dimensions, material, properties) may be applied to the additional adhesion layer, to the bonding layer and to the additional bonding layer, and what applies to the features of the encapsulation film (e.g. dimensions, material, properties) may be applied to the additional encapsulation film.

When the elements present within the stack 102 have a thickness, it is understood that this thickness is measured along, i.e. parallel to, the direction of stacking of these elements.

Furthermore, the manufacturing method comprises a crosslinking step comprising the crosslinking of the crosslinkable polymer material of the adhesion layer 104 in order to provide the bonding of the encapsulation film 103 to the photovoltaic cell 101, in particular to the front or back face of the photovoltaic cell 101. In other words, when the crosslinkable polymer material of the adhesion layer 104 transitions to its crosslinked state, it provides the bonding mentioned above. This contributes to forming an encapsulation envelope for the photovoltaic cell 101.

Such a manufacturing method has the advantage of using an encapsulation film 103 that can be handled in order to produce the encapsulation. In other words, the encapsulation film 103 used within the stack 102 is a self-supporting solid film. Furthermore, the thickness of the encapsulation film 103 may be calibrated so as to ensure a minimum encapsulant thickness at the end of the encapsulation of the photovoltaic cell 101. Another advantage is that the thickness of the adhesion layer 104 is limited owing to the fact that it is not intended to provide the encapsulation of the photovoltaic cell 101 by itself. Limiting this thickness makes it possible to limit the formation of gas bubbles, in particular air bubbles, in the encapsulant ultimately comprising the encapsulation film 103 and the adhesion layer 104, the crosslinkable polymer material of which is in the crosslinked state. Limiting this thickness also makes it possible to prevent the crosslinkable polymer material of the adhesion layer 104 from creeping over the edges of the stack 102 during its crosslinking.

In the present description, the term "crosslinkable polymer material" is understood to mean "a polymer material capable of being crosslinked", the state of which may transition to a crosslinked state, for example in a step of laminating the stack 102 as described below.

In general, what is meant by "encapsulation film based on a polymer material crosslinked at least at its gel point" is that the encapsulation film is in the solid state (it is then easily handled) and is in particular infusible. The encapsulation film 103 therefore behaves like a monolithic element that can be handled.

The gel point of a polymer material is characterized by a sharp increase in the complex viscosity of this polymer material and in the complex shear modulus of this polymer material. At the gel point and beyond, a three-dimensional network is formed and the chains of this polymer material can no longer slide over one another. Preferably, the polymer material of the encapsulation film 103 is crosslinked beyond its gel point, which makes it less brittle than at its gel point.

An encapsulation film within the meaning of the present description preferably comprises opposite first and second faces that are connected to one another at their periphery by an edge of the film.

In the present description, a crosslinkable polymer material exhibits in particular a degree of crosslinking that is strictly lower than the gel point of this polymer material. In particular, the crosslinkable polymer material is in the liquid state. What is understood by "material in the liquid state" is that the material has a tendency to flow due to the weak cohesion of its constituent molecules. In particular, the liquid state of the crosslinkable polymer material is such that this crosslinkable polymer material has a viscosity preferably of between 1 Pa·s and 50 Pa·s at a temperature of 25° C. In the present description, the viscosity values are given at atmospheric pressure. Such a viscosity makes it possible to obtain a thin adhesion layer, for example with a thickness of between 10 µm and 100 µm, which is especially suitable for bonding the encapsulation film while limiting the formation of gas bubbles. In particular, the viscosity of the crosslinkable polymer material, this preferably being applicable to the viscosity of the crosslinkable polymer material of the adhesion layer and/or to the viscosity of the crosslinkable polymer material of the additional adhesion layer, may be strictly higher than 5 Pa·s at a temperature of 25° C. and be lower than or equal to 50 Pa·s at a temperature of 25° C., and this viscosity preferably is strictly higher than 5 Pa·s at a temperature of 25° C. and is lower than or equal to 10 Pa·s at a temperature of 25° C.

Preferably, in the present description, any polymer material mentioned, whether it is crosslinked, crosslinked at least at its gel point or crosslinkable, may be chosen from the silicone family, also called the polysiloxane family. Hereinafter, the silicone is defined by a polymer chosen from the silicone family.

Furthermore, each element based on a crosslinked polymer material, a polymer material crosslinked at least at its gel point or a crosslinkable polymer material may also comprise additives in order to improve certain properties such as resistance to radiation or the filtration of certain wavelengths.

The polymer material of the encapsulation film and the polymer material of the adhesion layer may or may not be the same when they are in the crosslinked state.

Silicone may advantageously be used to encapsulate the photovoltaic cell 101. Such an encapsulation of the photovoltaic cell 101 is advantageous because silicone may be transparent, be electrically insulating, and exhibit environmental and thermal stability (i.e. no or little deterioration due to humidity, to oxygen or to acids at temperatures ranging between −200° C. and 200° C.). Additionally, silicone may improve the service life of the photovoltaic module in comparison with an encapsulant made of EVA. Silicone avoids the formation of acetic acid, unlike EVA. Silicone exhibits better stability to ultraviolet radiation. Silicone chemistry is flexible enough to precisely adjust the physicochemical properties (refractive index, viscosity, hardness, tensile strength) of the encapsulant while allowing mass production. By virtue of the low Young's modulus of silicone and the low glass transition temperature (e.g. −50° C.) of silicone, the mechanical properties of crosslinked silicone remain constant over a wide range of temperatures. With silicone, it is possible to encapsulate one or more photovoltaic cells for a space application at a temperature that can range between −65° C. and +200° C. and can be used down to −200° C.

The encapsulation of a photovoltaic cell 101 with silicone is generally difficult to implement because it is performed using liquid which leads to the presence of gas bubbles (in particular air bubbles), which may result in the destruction of the photovoltaic module 100 in the context of the space application. The use of the encapsulation film 103 and of the adhesion layer 104 as described makes it possible to limit the amount of crosslinkable polymer material in the liquid state used during encapsulation. It also means that the encapsulation of the photovoltaic cell 101 is compatible with lamination methods while limiting the creep of the crosslinkable polymer material during lamination.

In particular, any crosslinkable polymer material targeted in the present description may comprise, in particular consist of, two components A and B. Component A is a base, for example PDMS (for polydimethylsiloxane). Component B contains a vulcanizing agent, such as for example polysiloxane, and a catalyst in order to allow the polymer chains to branch so as to form a three-dimensional network such that the crosslinkable polymer material may, at the end of its crosslinking, form a corresponding layer made of solid and infusible material.

The crosslinkable polymer material used in the context of the present manufacturing method may be chosen from among: Sylgard® 184 from Dow Corning, Dow Corning 93-500, Siltech® CR 12-63, Siltech® CR 13-46, Elastosil RT 625 from Wacker, MAPSIL 213 from MAP COATING, MAPSIL 213B from MAP COATING, and MAPSIL QS1123 from MAP COATING. Furthermore, the encapsulation film 103 may have been obtained by crosslinking such a crosslinkable polymer material at least at its gel point.

Alternatively, the polymer material that is crosslinkable or crosslinked at least at its gel point may be based on acrylic polymers. The chemistry of the acrylics will be adapted according to the desired properties. In this case, the encapsulation film will preferably have been obtained on the basis of the same formulation as the acrylic resin forming the crosslinkable polymer material. In order for the crosslinked encapsulation film to have elastic properties akin to those of silicones, its glass transition temperature should preferably be lower than ambient temperature and, if not, it should be at least sufficiently elastic and deformable at the temperature of the lamination which may be carried out to form the photovoltaic module. In addition, a low glass transition temperature of the acrylic polymer forming the encapsulation film will improve the retention of mechanical properties at very low temperature, which is essential for space applications. The glass transition temperature (Tg) heavily depends on the monomer used. To obtain acrylic polymers with low Tg, basic monomers such as 2-ethylhexyl acrylate, n-butyl acrylate or isooctyl acrylate may, for example, be used.

Preferably, the adhesion layer 104 may have a thickness of between 10 μm and 100 μm. This thickness range is especially suitable for bonding an encapsulation film 103 with a thickness that is strictly greater than that of the adhesion layer 104 while limiting the occurrence of gas bubbles and the creep of the crosslinkable polymer material out of the photovoltaic module 100 during crosslinking, in particular when it is carried out by lamination.

The manufacturing method may comprise a step of forming the encapsulation film 103 (this is also applicable for the additional encapsulation film described below), for example by depositing crosslinkable polymer material in liquid form, in particular on a detachable support film made of polymer (also called a liner) such as, for example, PET (polyethylene terephthalate). Such deposition on the support film may be achieved by means of a coating, spraying, or doctor blade-based method. Next, a step of crosslinking the deposited crosslinkable polymer material is carried out to form a solid film, for example of silicone elastomer, before removing the detachable support film, which results in the encapsulation film 103 being obtained.

Preferably, any crosslinked polymer material within the stack 102 has been obtained by using the same crosslinkable polymer material in order to homogenize the physicochemical properties of the encapsulation envelope of the photovoltaic cell 101.

Preferably, the use of an encapsulation film 103 made of polymer material crosslinked at least at its gel point, but not fully, makes it possible to improve the bond between the adhesion layer 104 and the encapsulation film 103 at the end of the crosslinking of the crosslinkable polymer material and of the crosslinking of the polymer material of the encapsulation film 103.

Preferably, the encapsulation film 103 may have a thickness of between 25 μm and 400 μm. This thickness range is especially suitable for encapsulation of a photovoltaic cell 101, and allows the encapsulation film 103 to be handleable.

Preferably, the encapsulation film 103 is flexible. Its flexibility allows it to deform, in particular during the formation of the stack 102, or during a step of laminating the stack 102.

Figure 6:
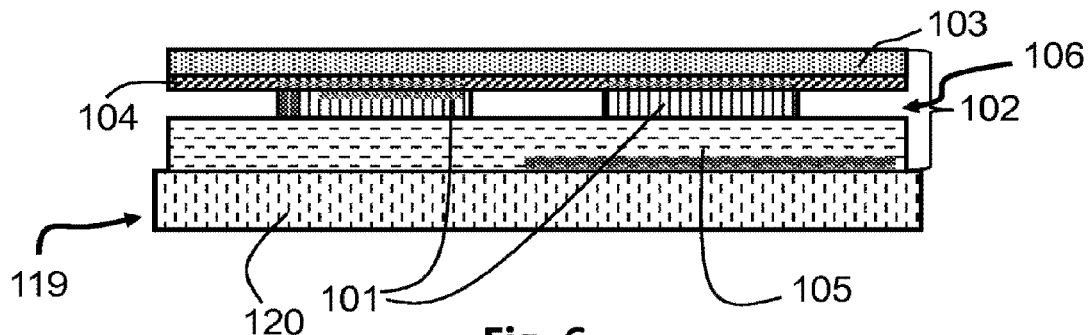
FIG. 6 illustrates, in sectional view, one step of the manufacturing method.
Figure 7:
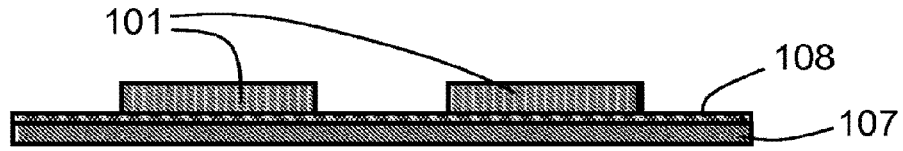
FIG. 7 illustrates, in sectional view, one step of the manufacturing method.
Figure 8:
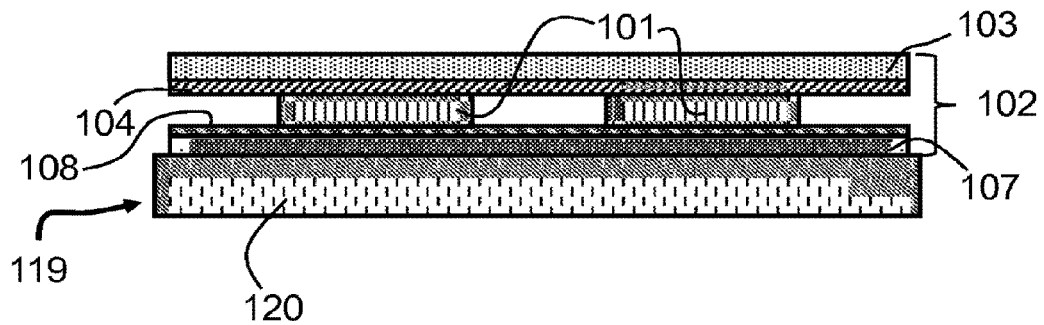
FIG. 8 illustrates, in sectional view, one step of the manufacturing method.
Figure 11:
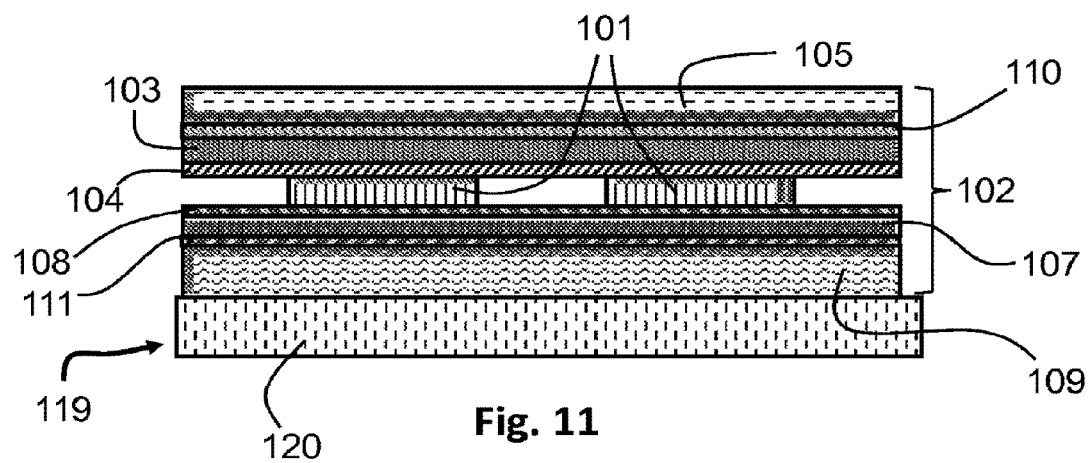
FIG. 11 illustrates, in sectional view, one step of the manufacturing method.

It follows from what has been mentioned above that lamination may also be implemented in the context of the present manufacturing method in order to allow the elimination of as much air as possible present in the stack 102, to crosslink any crosslinkable polymer material present within the stack 102, and to ensure adequate compaction of the photovoltaic module 100. As such, the manufacturing method, in particular its encapsulation step, advantageously comprises a step of laminating the stack 102 implementing the crosslinking step. Preferably, this lamination step is such that the stack 102 is laminated in vacuum and at a temperature suitable for obtaining the desired crosslinking of any crosslinkable polymer material present within the stack 102. Of course, the duration of vacuum lamination and the temperature applied are adapted to the polymer material to be crosslinked. In general, the lamination step may be carried out in vacuum, for example at 1 mbar, at a high temperature of, for example, between 60° C. and 150° C., and for a duration suitable for crosslinking each crosslinkable polymer material present within the stack 102, this duration being, for example, between 10 min and 240 min. For example, to crosslink Sylgard® 184, the lamination step may be carried out by placing the stack 102 in a vacuum of 1 mbar at 140° C. for at least 15 minutes. By way of example, FIGS. 6, 8 and 11 show a laminator 119 having a table 120 on which the stack 102 is positioned, the lamination step making it possible to go from the figure of FIG. 6 to FIG. 1, from FIG. 8 to FIG. 2, from FIG. 11 to FIG. 3, in particular by causing the deformation of the encapsulation film 103.

In general, the temperature used to laminate the stack 102 may be adapted according to the various materials present in the stack 102, taking into account their coefficient of thermal expansion in order to avoid producing undesirable curvatures within the photovoltaic module 100.

Preferably, the manufacturing method comprises a step of forming the adhesion layer 104 on the encapsulation film 103 (FIGS. 5 and 10) before bringing the adhesion layer 104 into contact with the photovoltaic cell 101 (FIGS. 6, 8, 11 and 19). In particular, the adhesion layer 104 is formed on the first face of the encapsulation film 103, preferably so as to completely cover this first face. The formation of the adhesion layer 104 on the encapsulation film 103 has the advantage of making the adhesion layer 104 able to be handled with the encapsulation film 103 which forms a support therefor, resulting in encapsulation being easier to implement.

According to a first embodiment illustrated in FIG. 1, at the end of the manufacturing method, the photovoltaic cell 101 is secured to a protective element 105, for example a transparent panel. The photovoltaic cell 101 is encapsulated against this protective element 105 by the encapsulation film 103 bonded to the photovoltaic cell 101 and to the protective element 105 by virtue of the adhesion layer 104, the polymer material of which is in its crosslinked state. To promote the bonding of the adhesion layer 104, during its crosslinking, to the photovoltaic cell 101 and to the protective element 105, the face 105a of the protective element 105 and the face 101a of the photovoltaic cell 101 in contact with the adhesion layer 104 may each be formed by a suitable bonding primer. In particular, the manufacturing method here comprises: a step of providing a photovoltaic module part 106 comprising the protective element 105 surmounted by at least one photovoltaic cell 101 (FIG. 4); a step of depositing the adhesion layer 104 on the first face of the encapsulation film 103 (FIG. 5); a step of bringing the adhesion layer 104 into contact with a face of the photovoltaic cell 101 opposite the protective element 105 (FIG. 6); a step of laminating the stack 102 then comprising the photovoltaic module part 106 so as to deform the adhesion layer 104 and the encapsulation film 103 to fit closely to the relief of a face of the photovoltaic module part 106 comprising the photovoltaic cell 101 and implement the crosslinking of the adhesion layer 104. This first embodiment makes it possible to easily manufacture a photovoltaic module 100 by directly encapsulating the photovoltaic cell 101 onto the protective element 105 bearing it. Here, the front face of the photovoltaic cell 101 may be oriented toward the protective element 105. According to this first embodiment, the encapsulation film 103 may comprise additives in order to provide sufficient protection for the desired application (resistance to radiation or filtration of certain wavelengths).

Figure 2:
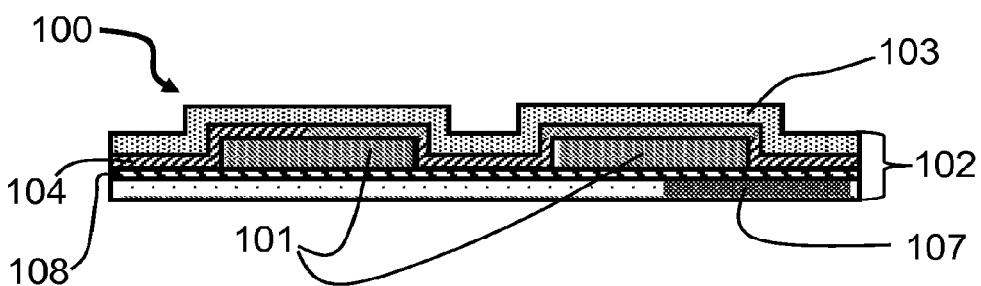
FIG. 2 shows a sectional view of a photovoltaic module formed by implementing the method for manufacturing the photovoltaic module according to a second embodiment of the invention.
Figure 3:
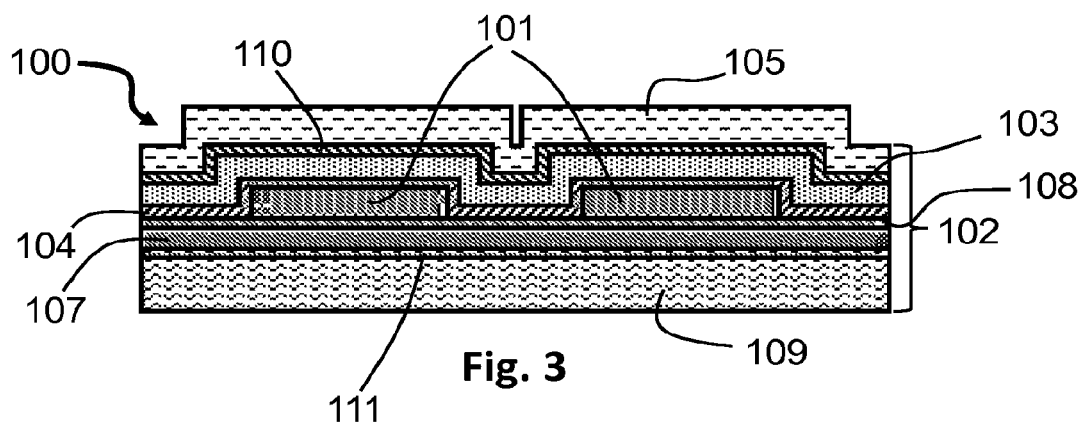
FIG. 3 shows a sectional view of the photovoltaic module formed by implementing a refinement of the method for manufacturing the photovoltaic module according to the second embodiment.
Figure 4:
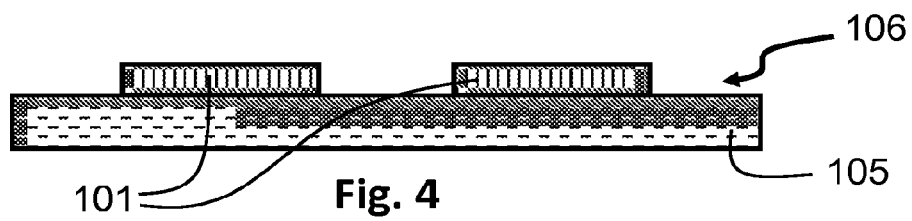
FIG. 4 illustrates, in sectional view, one step of the manufacturing method.
Figure 5:
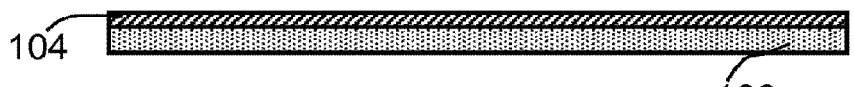
FIG. 5 illustrates, in sectional view, one step of the manufacturing method.

According to a second embodiment, as illustrated in FIGS. 2 and 3 in particular, the formation of the stack 102 is such that the stack 102 comprises a first part comprising the encapsulation film 103 and the adhesion layer 104 which is intended to bond this encapsulation film 103 to the photovoltaic cell 101. The stack 102 further comprises a second part comprising an additional encapsulation film 107 based on a polymer material crosslinked at least at its gel point and an additional adhesion layer 108 based on a crosslinkable polymer material intended to bond the additional encapsulation film 107 of the second part to the photovoltaic cell 101. The additional adhesion layer 108 is, in particular, formed on one face of the additional encapsulation film 107. Furthermore, the stack 102 comprises the photovoltaic cell 101 interposed between the first and second parts of the stack 102. In particular, the photovoltaic cell 101 is interposed between, and in contact with, the adhesion layer 104 and the additional adhesion layer 108, the front face of the photovoltaic cell 101 being in contact with the adhesion layer 104 or the additional adhesion layer 108. In other words, the stack 102 may successively comprise the encapsulation film 103, the adhesion layer 104, the photovoltaic cell 101, the additional adhesion layer 108, and the additional encapsulation film 107. Here, the crosslinking step comprises the crosslinking of the crosslinkable polymer material of the additional adhesion layer 108, in particular simultaneously with the crosslinking of the crosslinkable polymer material of the adhesion layer 104. Furthermore, the crosslinking step results in the encapsulation of the photovoltaic cell 101 between the encapsulation film 103 belonging to the first part and the additional encapsulation film 107 belonging to the second part. Preferably, the adhesion layer 104 and the additional adhesion 108 layer 108 allowing the encapsulation film 103 and the additional encapsulation film 107 to be bonded, respectively, to the photovoltaic cell 101 are brought into contact with one another at the periphery of the photovoltaic cell 101, for example by virtue of the lamination of the stack 102, in order to allow the formation of an encapsulation envelope for the photovoltaic cell 101. In other words, the adhesion layer 104 and the additional adhesion 108 layer 108 also allow the encapsulation film 103 and the additional encapsulation film 107 to be bonded to one another. The use of the encapsulation film 103 and of the additional encapsulation film 107 makes it possible to adjust the encapsulant thickness on either side of the photovoltaic cell 101 in order to limit this thickness for reasons of weight of the photovoltaic module 100 and transparency of the encapsulant or with a view to choosing a suitable thickness in order to limit stresses within the photovoltaic module 100. Here, at least the part (first part or second part) of the stack 102, toward which the front face of the photovoltaic cell 101 is oriented, is transparent, in particular after the crosslinking step. Of course, after the crosslinking step, the first and second parts of the stack 102 may be transparent. According to this second embodiment, a protective element may be bonded to the encapsulation film 103 or to the additional encapsulation film 107 on its face opposite the photovoltaic cell 101.

In order to optimize the manufacturing method in the context of the second embodiment, the first and second parts of the stack 102 may be formed separately (FIGS. 5 and 7) before associating them with interposition of the photovoltaic cell 101 (FIG. 8). As such, the formation of the stack 102 may comprise: a step of forming the first part; a step of forming the second part; a step of associating the second part of the stack 102 with the second part of the stack 102 with interposition of the photovoltaic cell 101 which is then in contact with the adhesion layer 104 and with the additional adhesion layer 108; a step of bringing the adhesion layer 104 into contact with the additional adhesion layer 108, thereby forming the encapsulation envelope. In particular, the bringing of the adhesion layer 104 into contact with the additional adhesion layer 108 is ensured by the step of laminating the stack 102. Here, the crosslinking step allows the crosslinking of the crosslinkable polymer material of the adhesion layer 104 and the crosslinkable polymer material of the additional adhesion layer 108 in order to encapsulate the photovoltaic cell 101.

Depending on the requirements, it may be necessary to encapsulate the photovoltaic cell 101 between a first protective element 105 and a second protective element 109 (FIG. 3). Preferably, one of the first and second protective elements 105, 109 forms a front face of the photovoltaic module 100 toward which the front face of the photovoltaic cell 101 is oriented, and the other of the first and second protective elements 105, 109 forms a protective element placed on the back side, or forming a back face, of the photovoltaic module 100. There is therefore a need to bond the first and second protective elements 105, 109 to the encapsulation film 103 and to the encapsulation film 107, respectively, preferably while limiting the formation of gas bubbles during manufacture. This may advantageously be implemented using a bonding layer 110 and an additional bonding layer 111, each based, in particular, on a crosslinkable polymer material which is preferably identical to that of the adhesion layer 104 and to that of the additional adhesion layer 108. Thus, to meet this need, the formation of the stack 102 may be such that the stack 102 comprises first and second protective elements 105, 109 between which the first and second parts of the stack 102 are arranged. The first part of the stack 102 then comprises a bonding layer 110 based on a crosslinkable polymer material which is intended to bond the encapsulation film 103, belonging to the first part, to the first protective element 105. The second part then comprises an additional bonding layer 111 based on a crosslinkable polymer material which is intended to bond the additional encapsulation film 107, belonging to the second part, to the second protective element 109. The crosslinkable polymer material of each of the layers 104, 108, 110, 111 is crosslinked during the crosslinking step. In other words, the crosslinking step comprises the crosslinking of the crosslinkable polymer material of the bonding layer 110 and of the crosslinkable polymer material of the additional bonding layer 111, in particular simultaneously with the crosslinking of the crosslinkable polymer material of the adhesion layer 104 and with the crosslinking of the crosslinkable polymer material of the additional adhesion layer 108, such that the crosslinking step results in the formation of the encapsulation envelope of the photovoltaic cell 101 bonded to the first and second protective elements 105, 109.

In particular, the step of forming the first part may be such that the first part is formed on the first protective element 105 (FIG. 10), and the step of forming the second part may be such that the second part is formed on the second protective element 109 (FIG. 9) before associating (FIG. 11) the first and second parts with interposition of the photovoltaic cell 101 in order to obtain the stack 102. This is straightforward to implement and makes it possible to limit the risk of breakage of the photovoltaic cell 101 by placing it in the stack at the last moment.

To form the first part of the stack 102 on the first protective element 105, the manufacturing method preferably comprises, in particular successively (FIG. 10): a step of depositing the bonding layer 110, in particular on a layer of bonding primer of the first protective element 105 in order to promote the bonding of the bonding layer 110 to this first protective element 105 during the crosslinking of its crosslinkable polymer material; a step of positioning the encapsulation film 103 on the bonding layer 110; a step of depositing the adhesion layer 104 on the encapsulation film 103.

To form the second part of the stack 102 on the second protective element 109, the manufacturing method preferably comprises, in particular successively (FIG. 9): a step of depositing the additional bonding layer 111, in particular on a layer of bonding primer of the second protective element 109 in order to promote the bonding of the additional bonding layer 111 to this second protective element 109 during the crosslinking of its crosslinkable polymer material; a step of positioning the additional encapsulation film 107 on the additional bonding layer 111; a step of depositing the additional adhesion layer 108 on the additional encapsulation film 107.

Figure 9:
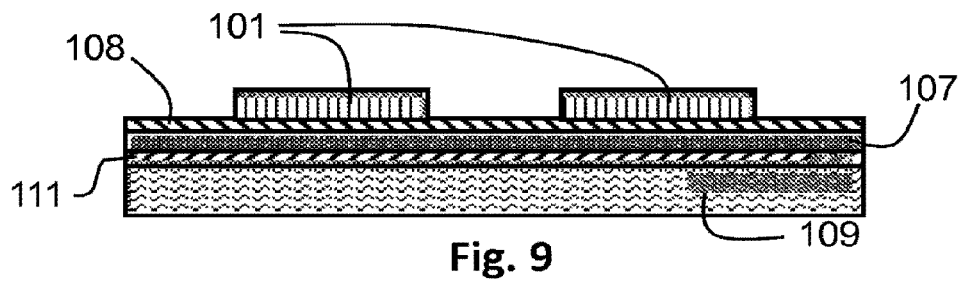
FIG. 9 illustrates, in sectional view, one step of the manufacturing method.
Figure 10:
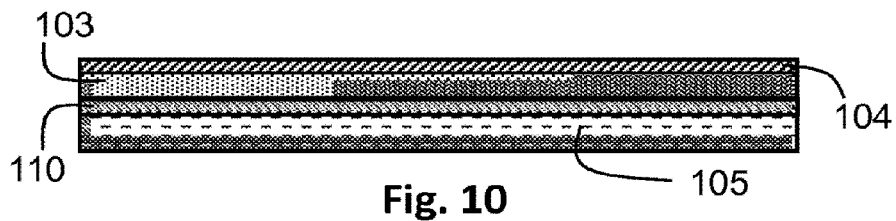
FIG. 10 illustrates, in sectional view, one step of the manufacturing method.

The photovoltaic cell 101, preferably coated with a bonding primer in order to promote its adhesion to the additional adhesion layer 108 and to the adhesion layer 104, may be brought into contact with the additional adhesion layer 108, or the adhesion layer 104, before associating the two parts of the stack. In FIG. 9, the photovoltaic cell 101 is positioned on the additional adhesion layer 108 before associating the first and second parts of the stack 102 in the way that can be seen in FIG. 11: this is preferred in order to avoid encountering the problem of holding the cell on one part of the stack which is to be flipped over onto the other.

Preferably, the protective element forming a front face of the photovoltaic module, for example the second protective element 109, is transparent. Such a protective element may comprise a panel of glass, or of transparent polymer such as colorless polyimide, or of PET (polyethylene terephthalate such as, for example, MYLAR®), or of PEN (polyethylene naphthalate), or of ethylene-chlorotrifluoroethylene copolymer (for example HALAR®), or of fluorinated ethylene propylene (FEP), or of polyether ether ketone (PEEK). Preferably, the panel has a face on which a layer of bonding primer is formed in order to promote the bonding of the bonding layer 110 or of the corresponding additional bonding layer 111 during its crosslinking. Before forming this layer of bonding primer on the face of the panel, it is preferable to perform a corona or plasma treatment on this face in order to optimize the adhesion of the layer of bonding primer. The role of this protective element forming the front face of the photovoltaic module 100 is to protect it from external attack such as, for example, from hail, moisture or molecular oxygen in a terrestrial environment or, for example, from debris, atomic oxygen or radiation in a space environment.

The protective element placed on the back side or forming a back face is not necessarily transparent, and it may comprise a support made of carbon composite associated with a honeycomb made of aluminum for heat dissipation, a foam, a glass panel, a deformable polymer film that is able to provide electrical insulation-type protection, or a fabric. The protective element placed on the back side may be flexible or rigid, and if it is rigid then the protective element located on the front face is flexible in order to allow the lamination of the assembly comprising the stack 102 arranged between the first and second protective elements. Preferably, this protective element has a face formed by a layer of bonding primer in order to promote the bonding of a corresponding bonding layer or additional bonding layer. Before forming this layer of bonding primer, it is preferable to perform a corona or plasma treatment in order to optimize the adhesion of the layer of bonding primer to the corresponding protective element. The protective element placed on the back side may serve as a mechanical support and as a barrier to moisture, molecular oxygen, radiation, or atomic oxygen.

Figure 12:
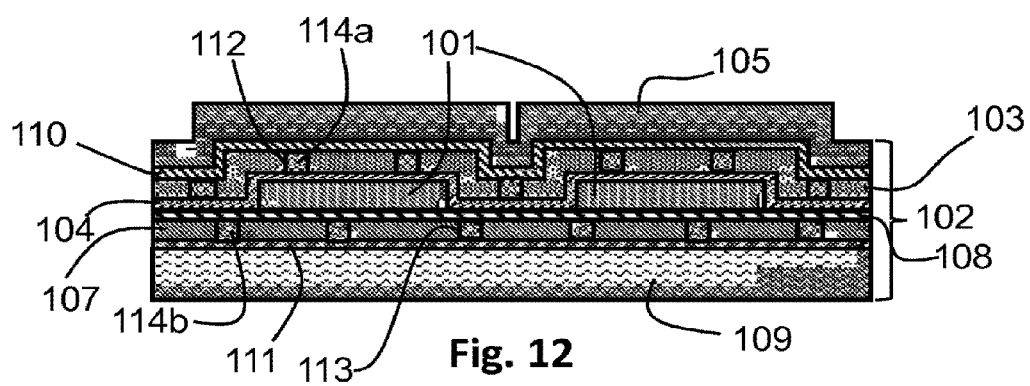
FIG. 12 illustrates, in sectional view, a refinement of the manufacturing method.
Figure 13:
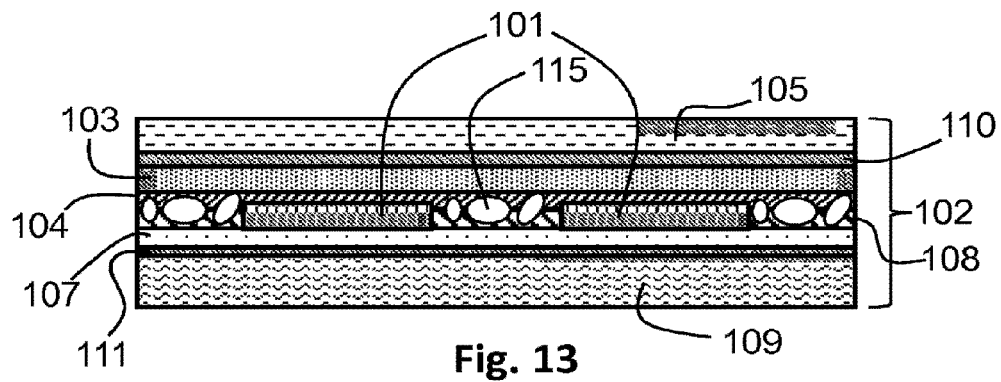
FIG. 13 illustrates, in sectional view, a photovoltaic module obtained at the end of the manufacturing method according to one embodiment of the second embodiment.

According to one refinement of the second embodiment comprising the first and second protective elements 105, 109 as illustrated in FIG. 12, the encapsulation film 103 belonging to the first part of the stack 102 and the additional encapsulation film 107 belonging to the second part of the stack 102 are perforated such that, within the stack 102: the adhesion layer 104 and the bonding layer 110 of the first part of the stack 102 are connected to one another at the holes 112 in the encapsulation film 103 belonging to the first part, in particular by crosslinkable polymer material 114a present in said holes 112 of the encapsulation film 103; and the additional adhesion layer 108 and the additional bonding layer 111 of the second part of the stack 102 are connected to one another at the holes 113 in the additional encapsulation film 107 belonging to the second part of the stack, in particular by crosslinkable polymer material 114b present in said holes 113 of the additional encapsulation film 107. Preferably, the holes described are holes that pass through the encapsulation film or the additional encapsulation film across its thickness. The holes may each have a diameter of between 200 μm and 2 mm. Below 200 μm in diameter, the holes would have difficulty being filled with crosslinkable polymer material, and above 2 mm in diameter, the holes would require the use of too much crosslinkable polymer material which would promote the formation of gas bubbles or the flow of this crosslinkable polymer material during lamination. Preferably, less than 50% of the volume of the encapsulation film 103 is occupied by the holes in this encapsulation film 103 in order to ensure satisfactory sturdiness of this encapsulation film 103 (beyond 50% the corresponding film would be very difficult to handle without breaking it), this applying equally to the additional encapsulation film 107. What is meant by "at the holes" is that, within the stack 102, crosslinkable polymer material 114a, 114b is present in the holes in the encapsulation film 103 and in the additional encapsulation film 107. The crosslinkable polymer material 114a present in the holes 112 may have been deposited in the holes of the encapsulation film 103, in particular by flowing as a result of gravity, at the time of the formation of the adhesion layer 104 on the encapsulation film 103. The crosslinkable polymer material 114b present in the holes 113 may have been deposited in the holes of the additional encapsulation film 107, in particular by flowing as a result of gravity, at the time of the formation of the additional adhesion layer 108 on the additional encapsulation film 107. The crosslinking step is then such that the crosslinkable polymer material 114a, 114b present in the holes 112, 113 crosslinks and improves the cohesion of the encapsulation envelope. Specifically, this makes it possible to limit the delamination of the encapsulation envelope in contact with the encapsulation film 103 and in contact with the additional encapsulation film 107. This is especially advantageous when the encapsulation film 103, the additional encapsulation film 107, the crosslinked polymer material in the holes and the crosslinked polymer materials of the adhesion layer 104, of the additional adhesion layer 108, of the bonding layer 110, and of the additional bonding layer 111 comprise silicone because each encapsulation film (additional or otherwise) is then sandwiched and passed through at a plurality of locations by a monolithic element made of crosslinked silicone formed from two crosslinked layers of polymer material which are arranged on either side of this encapsulation film.

If the first and second protective elements 105, 109 are rigid. Gas bubbles 115, in particular air bubbles, are generally found in the encapsulation envelope after the lamination step (from FIG. 11 to FIG. 13). This is due in particular to a lack of material from the adhesion layer 104 and from the additional adhesion layer 108 which are intended to bond the encapsulation film 103 and the additional encapsulation film 107, respectively, to the photovoltaic cell 101. Specifically, the sum of the thicknesses of the adhesion layer 104, of the additional adhesion layer 108, of the bonding layer 110, and of the additional bonding layer 111 is less than the thickness of the photovoltaic cell 101 such that this results in the formation of these bubbles 115 at the periphery of the photovoltaic cell 101. Thus, there is therefore a risk of the photovoltaic module 100 bursting, in particular if it is placed in an environment where the pressure differs greatly from the pressure within the bubbles. There is therefore a need to find a solution to limit the formation of such bubbles. Increasing the thickness of the layers of crosslinkable polymer material before lamination is not a solution in that lamination causes the crosslinkable polymer material to flow toward the outside of the stack 102.

As such, to avoid the formation of bubbles 115 in the context of the use of a stack 102 comprising the first and second protective elements 105, 109, at least one of the first and second protective elements 105, 109 is deformable such that it undergoes deformation during the lamination step. In other words, the first protective element 105 and/or the second protective element 109 are/is deformable. For example (FIGS. 3 and 12), the first protective element 105 is deformable and its deformation during the lamination step causes the deformation of the encapsulation film 103, of the adhesion layer 104 in contact with this encapsulation film 103 and of the bonding layer 110 in contact with this encapsulation film 103 in order to limit the occurrence of bubbles. These deformations allow the formation of an encapsulation envelope by fitting closely to the photovoltaic cell 101 and bringing the adhesion layer 104 and the additional adhesion layer 108 into contact around the photovoltaic cell 101.

In particular, in the context of the use of a laminator 119 with a flat lamination table 120, the stack 102 is positioned on the table 120 such that the deformable first protective element 105 is at a distance from the table 120 (FIG. 11). If both protective elements 105, 109 are deformable, the positioning on the table does not matter, and one of the first and second protective elements 105, 109 is placed in contact with the table 120 (this protective element will remain flat) while the other of the first and second protective elements is at a distance from the table 120 (this protective element will deform during lamination).

Figure 14:
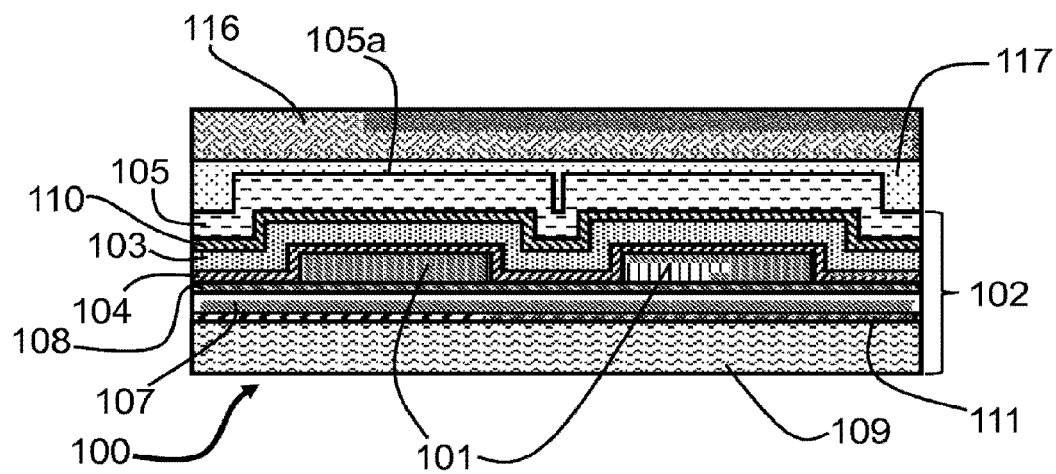
FIG. 14 illustrates, in sectional view, the addition of a support to the stack shown in FIG. 3.

Depending on the intended use of the photovoltaic module 100, it may need to be rigid on the side of the deformed protective element, in particular when this element is located on the side of the back face of the photovoltaic module 100. In this case, as illustrated in FIG. 14, the manufacturing method may comprise, after the lamination step, a step of bonding a support 116 (also called a composite support) to the deformed protective element, i.e. to the deformed first protective element or to the deformed second protective element (in particular the first protective element 105). The support 116 may be bonded, to a face 105a of the first protective element 105 opposite the photovoltaic cell 101, using an adhesive 117, such as, for example, a thermoplastic adhesive (for example an epoxy adhesive such as Redux® 312 from Hexcel), this being especially suitable for a space application of the photovoltaic module 100. The support 116 may also be bonded using an ionomer- or EVA-based adhesive 117, this being especially suitable for a terrestrial application of the photovoltaic module 100. Preferably, to avoid the presence of cavities, and therefore of gas bubbles, within the photovoltaic module 100, the material used to allow the support 116 to adhere to the deformed first protective element 105 has, once interposed between the support 116 and the first protective element 105, a thickness that makes it possible to fill any cavity in the face of the first protective element 105 to which the support 116 has to be bonded. Depending on the requirements, the bonding of the support 116 using adhesive requires merely bonding through contact, or the implementation of an additional lamination step. The support 116 may be a composite support and may comprise a honeycomb made of aluminum sandwiched between two carbon skins of the support 116, the first protective element 105 being bonded to one of the two carbon skins of the support.

One particular example of the second embodiment is now described. In this example: each layer of bonding primer is made of Wacker® Primer G 790 and has a thickness of 1 µm to 10 µm for a GSM ranging from 5 g/m$^2$ to 50 g/m$^2$; each adhesion layer, additional or otherwise, and each bonding layer, additional or otherwise, hereinafter referred to as a layer of crosslinkable polymer material, is made of liquid silicone (in particular of Sylgard® 184 from Dow Corning) and has a thickness of 50 µm; each encapsulation film is formed by a crosslinked film made of Elastosil® from Wacker and has a thickness of 100 µm. The manufacturing method comprises the formation of first and second portions of the stack 102 which are intended to form, with a photovoltaic cell 100 or rows of photovoltaic cells, the stack 102. The formation of the first portion successively comprises: corona treatment of a glass panel with a thickness of 100 µm and dimensions of 20 cm by 20 cm; depositing a layer of bonding primer on one face of the panel that has undergone the corona treatment, this layer of bonding primer being dried for at least 30 minutes; depositing a first layer of crosslinkable polymer material on the layer of bonding primer, for example using a brush; positioning an encapsulation film based on a polymer material crosslinked at least at its gel point on the first layer of crosslinkable polymer material; depositing a second layer of crosslinkable polymer material on this encapsulation film, for example using a brush; positioning a photovoltaic cell, previously coated with bonding primer on the front and back faces, on the second layer of crosslinkable polymer material. The formation of the second portion of the stack successively comprises: corona treatment of a polyimide film (for example a DUPONT™ KAPTON® HN polyimide film) with a thickness of 50 µm and dimensions of 20 cm by 20 cm; depositing a layer of bonding primer on one face of the polyimide film that has undergone the corona treatment, this layer of bonding primer being dried for at least 30 minutes; depositing a first layer of crosslinkable polymer material on the layer of bonding primer, for example using a brush; positioning an additional encapsulation film based on a polymer material crosslinked at least at its gel point on the first layer of crosslinkable polymer material; depositing a second layer of crosslinkable polymer material on this additional encapsulation film, for example using a brush. The two portions are then associated to form the stack by bringing the second layer of crosslinkable polymer material of the second portion into contact with the photovoltaic cell. Next, the stack is laminated, for example in a vacuum of 1 mbar at 140° C. for 20 minutes, placing the glass panel in contact with the table of the laminator. The laminated stack may be used directly as a photovoltaic module or be associated with a rigid support as needed.

According to a first case of the particular example of the second embodiment, the laminated stack is again placed on the table of the laminator with the glass panel downward and the polyimide film upward. A 200 μm ionomer film is placed on the polyimide film, and then the composite support as described above is placed on the ionomer film. The whole assembly is then laminated, for example in a vacuum of 1 mbar at 150° C. for 20 minutes.

According to a second case of the particular example of the second embodiment, a layer of bonding primer is formed on the polyimide film of the laminated stack, and a layer of bonding primer is formed on the composite support as described above, each of these layers of bonding primer being dried for 30 minutes. Next, a layer of liquid silicone, in particular of Sylgard® 184, is deposited on the bonding primer formed on the polyimide film, and is then brought into contact with the bonding primer of the composite support. Depending on the result of the preceding lamination of the stack, the thickness of the layer of liquid silicone may be dependent on the thickness of the photovoltaic cell, for example the thickness of the layer of liquid silicone may be 50 μm directly above the photovoltaic cell and 200 μm at the periphery of the photovoltaic cell due to the deformation of the polyimide film. The whole assembly is then pressed in order to force the composite support toward the glass panel using a pressure of 20 kg/m². The pressed whole assembly is then heated at 100° C. for 45 minutes in order to crosslink the silicone.

Figure 15:
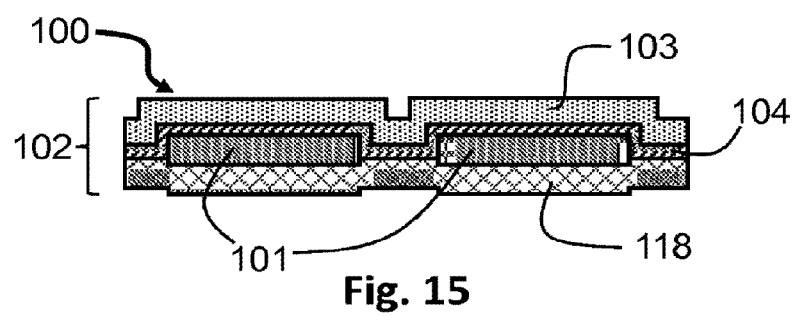
FIG. 15 illustrates, in sectional view, a photovoltaic module obtained by implementing a third embodiment of the manufacturing method.

According to a third embodiment, for example as illustrated in FIG. 15, which is especially suitable for a space application of the photovoltaic module 100, the photovoltaic cell 101 is bonded to a substrate 118, this substrate 118 being, in particular, flexible. What is meant by "flexible substrate 118" is, in particular, that the substrate 118 has a drape coefficient of between 0 and 0.8, thus the substrate 118 is preferably a fabric. In particular, it is the back face of the photovoltaic cell 101 which is bonded to this substrate 118. This makes it possible to obtain a photovoltaic module 100 that is lightweight and exhibits adequate flexibility. The flexibility of the substrate 118 makes it possible to form a photovoltaic module 100 that may be easily folded or deployed.

As such, the third embodiment may be such that the formation of the stack 102 comprises a step of providing the flexible substrate 118 comprising at least one portion that is impregnated, or being entirely impregnated, with crosslinkable polymer material, i.e. the crosslinkable polymer material impregnating the fabric is in the liquid state. Hereinafter, the wording "impregnated substrate" covers the impregnation (and more particularly the result of the impregnation) both of the portion of the substrate and of the entire substrate with the crosslinkable polymer material. Furthermore, the manufacturing method comprises a step of bringing the back face of the photovoltaic cell 101 into contact with the impregnated portion. Here, the back face is opposite the front face of the photovoltaic cell 101, said front face being in contact with the adhesion layer 104 within the stack 102. Thus, the crosslinking step comprises the crosslinking of the crosslinkable polymer material impregnating the substrate 118, in particular simultaneously with the crosslinking of the crosslinkable polymer material of the adhesion layer 104, resulting in the encapsulation of the photovoltaic cell 101. Here, the encapsulation film 103 and the crosslinkable layer 104 in its crosslinked state are transparent.

According to a development of this third embodiment, the manufacturing method may comprise the step of laminating (FIGS. 16, 19 and 20), in the laminator 119, the stack 102 arranged such that the front face of the photovoltaic cell 101 is oriented toward the table 120 of the laminator 119. This stack 102 comprises a supple sheet 121 (i.e. made of deformable material), for example made of silicone, arranged between the encapsulation film 103 and the table 120 of the laminator 119 such that, during the lamination step, moving the photovoltaic cell 101 (from FIG. 19 to FIG. 20) closer to the table of the laminator 120 causes deformation of the supple sheet 121, forming a depression 122 located in the supple sheet 121 that has the shape of the photovoltaic cell 101. This has the advantage of limiting the deformation of the substrate 118, and therefore of the back face of the photovoltaic module 100 formed by the face of the substrate 118 opposite the photovoltaic cell 101. The lamination allows the deformation both of the substrate 118 and of the encapsulation film 103 so as to fit closely to the photovoltaic cell 101. The deformation of the supple sheet 121 makes it possible to limit the deformation of the substrate 118 during lamination in order to ensure satisfactory homogeneity of the crosslinkable polymer material impregnating substrate 118.

The supple sheet 121 may be made of silicone and may have a thickness of between 0.3 mm and 5 mm. Such a supple sheet 121 may have a hardness of between 10 and 50 on the Shore A scale. These characteristics of the supple sheet 121 make it possible to obtain the desired deformation thereof, during the lamination step, by pressing the photovoltaic cell 101 into the supple sheet 121, resulting in the formation of the depression 112.

Figure 16:
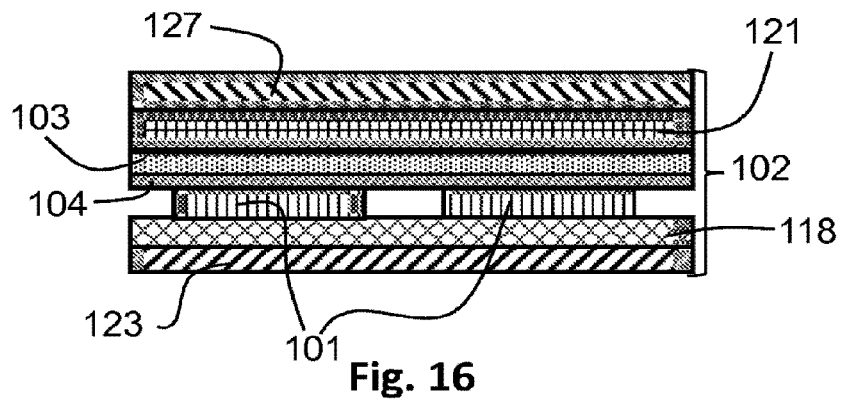
FIG. 16 illustrates, in sectional view, one step of the third embodiment of the manufacturing method.
Figure 17:
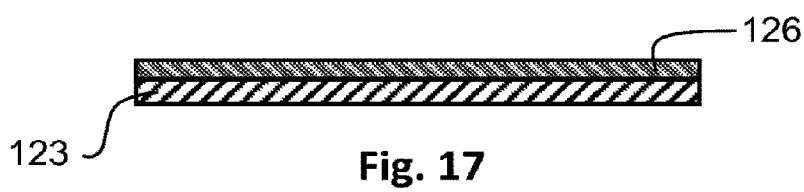
FIG. 17 illustrates, in sectional view, one step of the third embodiment of the manufacturing method.
Figure 18:
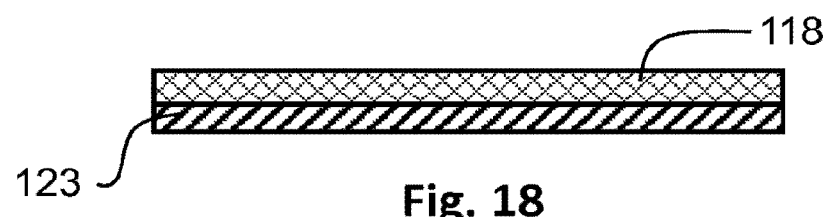
FIG. 18 illustrates, in sectional view, one step of the third embodiment of the manufacturing method.
Figure 19:
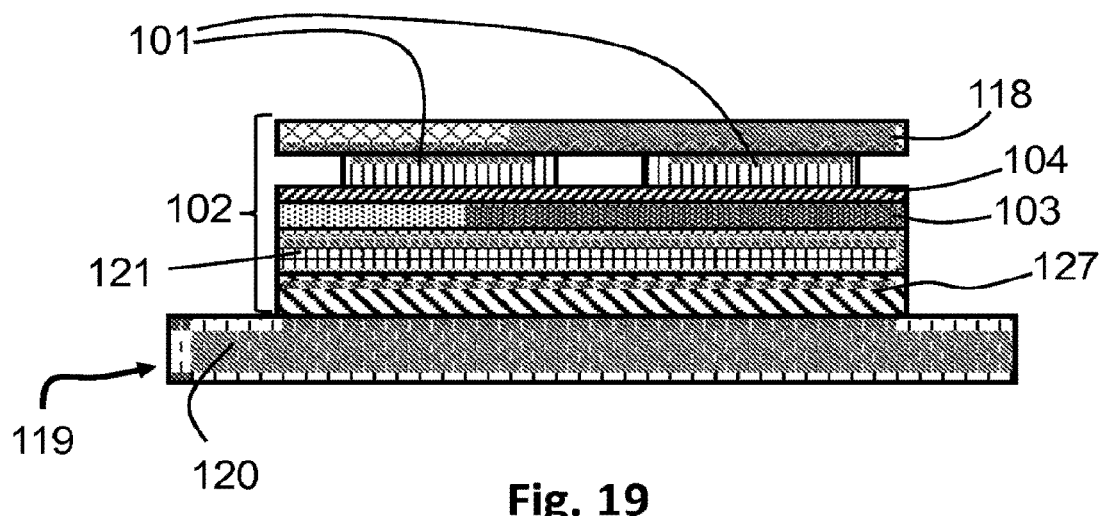
FIG. 19 illustrates, in sectional view, one step of the third embodiment of the manufacturing method.
Figure 20:
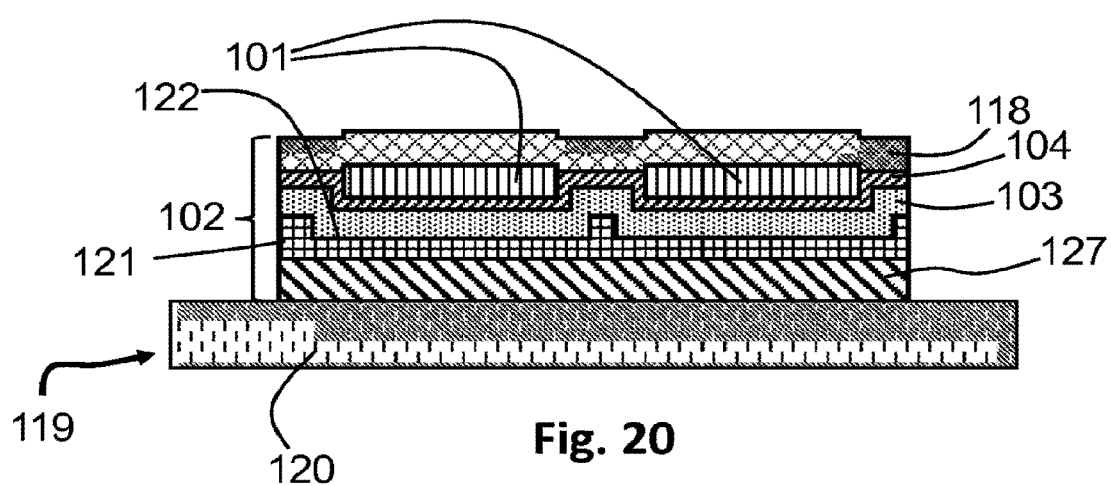
FIG. 20 illustrates, in sectional view, one step of the third embodiment of the manufacturing method.

One particular example of this third embodiment is now described for which a stack 102 (FIG. 16) is formed which successively comprises a first rigid support 123, the flexible substrate 118 impregnated with the crosslinkable polymer material, the photovoltaic cell 101, the adhesion layer 104, the encapsulation film 103, the supple sheet 121 and a second rigid support 127. The first and second rigid supports 123, 127 may each be a glass panel. To impregnate the substrate 118, it is possible to form, during the formation of the stack 102, a layer 126 of crosslinkable polymer material, for example on the first rigid support 123 (FIG. 17), before transferring the substrate 118 onto this layer 126 of crosslinkable polymer material which is then absorbed by the substrate 118 (FIG. 18). Crosslinkable polymer material is then added, for example using a brush, to the substrate 118 in order to enhance the impregnation thereof. After the addition of the crosslinkable polymer material to the substrate 118, this substrate 118, then coated with crosslinkable polymer material, is "smoothed" using a scraper or a bubble roller in order to homogenize its impregnation with crosslinkable polymer material: the smoothing therefore corresponds in particular to scraping the surface of the substrate 118. The impregnation of the substrate 118 may alternatively be carried out by spraying, by dipping or by coating. The photovoltaic cell 101, preferably covered with a bonding primer, is then positioned back face on the second face of the impregnated flexible substrate 118 (FIG. 16). Next, the encapsulation film 103, the first face of which is coated with the adhesion layer 104, said adhesion layer 104 being in contact with the photovoltaic cell 101, the supple sheet 121 and the second rigid support 127 are stacked (FIG. 16) successively on top of the photovoltaic cell 101. The overall assembly is then flipped over on the table 120 of the laminator (FIG. 19) by bringing the second rigid support 127 into contact with the table of the laminator, and then the first rigid support 123 is removed, resulting in the formation of the stack 102 to be laminated comprising, successively from the table 120 of the laminator: the second rigid support 127, the supple sheet 121, the encapsulation film 103, the adhesion layer 104, the photovoltaic cell 101 and the impregnated flexible substrate 118. The stack 102 thus formed is then hot-laminated in the laminator 119 at a crosslinking temperature in order to crosslink the crosslinkable polymer material of the adhesion layer 104 and the crosslinkable polymer material impregnating the substrate 118. On leaving the laminator, the second rigid support 127 and the supple sheet 121 are removed, resulting in the stack 102 of FIG. 15 being obtained, the deformation of the flexible substrate 118 of which is limited. The first and second rigid supports 123, 127 have, in particular, the function of allowing the overall assembly of the stack 102 to be handled, for example allowing it to be flipped.

The fabric forming the flexible substrate 118 may have a GSM of between 20 g/m$^2$ and 300 g/m$^2$.

As mentioned above, the flexible substrate 118 may be woven, i.e. be a fabric. Such a fabric may be chosen from among a glass fiber fabric, an aramid fiber fabric such as Kevlar® (Kevlar® corresponding to poly(p-phenylene terephthalamide), also called PPD-T) or such as Twaron®, corresponding to a p-phenylene terephthalamide (PpPTA), and an aromatic polyester fabric such as Vectran®. These fabrics are especially suitable for bonding each photovoltaic cell to the substrate 118 while retaining flexibility of the substrate 118 after crosslinking of the crosslinkable polymer material bonding, in its crosslinked state, the photovoltaic cells.

The crosslinkable polymer material intended to impregnate the substrate 118 may be based on silicone, such as, for example, Sylgard® 184 (observing, for example, a ratio of 10:1 for component A and component B, respectively), or 93-500 from Dow Corning, or RTV-S691 silicone adhesive from Wacker. For example, there must be at least 100 g of crosslinkable polymer material per square meter of substrate 118 to be impregnated in the case of the substrate 118 formed by a glass fiber fabric of 100 g/m$^2$. This minimum amount may of course vary depending on the characteristics of the substrate 118, in particular its thickness, its mesh density, or its surface tension. This crosslinkable product is degassed, for example in a vacuum chamber, before use.

In a way that is applicable to everything that has been described above, the crosslinkable polymer material of each adhesion or bonding layer (additional or otherwise), and the material of each encapsulation film (additional or otherwise) are preferably of the same nature. What is meant by the same nature is that they may have been obtained on the basis of the same crosslinkable polymer material formulation and crosslinked under the same conditions (temperature, time, pressure) but, where applicable, at different times. They consequently exhibit similar mechanical and optical properties. For example, similar coefficients of thermal expansion limit the risks of breakage and delamination of the photovoltaic module 100. Similar refractive indices limit reflections at the interfaces and therefore increases the efficiency of the photovoltaic cell 101. Where applicable, this also applies to the crosslinkable polymer material impregnating the substrate 118. The use of the same crosslinkable polymer material formulation allows better cohesion of the encapsulation envelope by promoting the bonding of the materials so as to avoid delamination of the stack 102.

In general, a bonding primer within the meaning of the present description is a material adopting, preferably, the form of a layer which facilitates the bonding of the crosslinkable polymer material of a corresponding layer, this bonding primer possibly comprising reactive siloxanes and silanes.

Of course, it follows from the present description that any photovoltaic module 100 architecture obtained according to the described manufacturing method may be the subject of the invention. As such, the invention also relates to a photovoltaic module 100 comprising the stack 102 for which any crosslinkable polymer material has been crosslinked. This stack 102 comprises the photovoltaic cell 101 and a bilayer. The bilayer is formed by/comprises the encapsulation film 103 based on a crosslinked polymer material and the adhesion layer 104 based on a crosslinked polymer material, the adhesion layer 104 being arranged between the encapsulation film 103 and the photovoltaic cell 101. The adhesion layer 104 bonds the encapsulation film 103 to the photovoltaic cell 101. One advantage of such a photovoltaic module 100 is that the thickness of the encapsulant is homogeneous. Where applicable, such a photovoltaic module 100 may be foldable and may be used at temperatures ranging from −200° C. to 200° C.; being free of bubbles, it may be used in a space environment in vacuum.

More particularly, the stack 102 of the photovoltaic module 100 may comprise:

the adhesion layer 104 based on a crosslinked polymer material (i.e. the adhesion layer 104, the crosslinkable polymer material of which has been crosslinked during the manufacturing method), the encapsulation film 103, the first protective element 105 (in particular formed by a polyimide film), the bonding layer 110 based on a crosslinked polymer material (i.e. the bonding layer 110, the crosslinkable polymer material of which has been crosslinked during the manufacturing method), the bonding layer 110 bonding the encapsulation film 103 to the first protective element 105, the additional adhesion layer 108 based on a crosslinked polymer material (i.e. the additional adhesion layer 108, the crosslinkable polymer material of which has been crosslinked during the manufacturing method), the additional encapsulation film 107 based on a crosslinked polymer material, said additional encapsulation film 107 being bonded to the photovoltaic cell 101 by the additional adhesion layer 108, the additional bonding layer 111 based on a crosslinked polymer material (i.e. the additional bonding layer 111, the crosslinkable polymer material of which has been crosslinked during the manufacturing method), the second protective element 109 (in particular made of glass) bonded to the additional encapsulation film 107 by the additional bonding layer 111. Here, the first and second protective elements 105, 109 ensure the protection of the module as described above. In other words, the stack 102 may successively comprise the first protective element 105, the bonding layer 110, the encapsulation film 103, the adhesion layer 104, the photovoltaic cell 101, the additional adhesion layer 108, the additional encapsulation film 107, the additional bonding layer 111 and the second protective element 109.

According to one refinement (FIG. 12) of the photovoltaic module 100, the encapsulation film 103 and the additional encapsulation film 107 are perforated such that: the adhesion and bonding layers 104, 110 are connected to one another at the holes 112 in the encapsulation film 103, in particular by crosslinked polymer material present in said holes 112 of the encapsulation film 103; the additional adhesion and bonding layers 108, 111 are connected to one another at the holes 113 in the additional encapsulation film 107, in particular by crosslinked polymer material present in said holes 113 of the additional encapsulation film 107. This makes it possible to limit the delamination of the photovoltaic module 100 over time.

According to one embodiment, the photovoltaic module comprises the flexible substrate 118 bonded to the back face of the photovoltaic cell 101 by crosslinked polymer material present in at least a portion of the substrate 118, and the photovoltaic cell 101 comprises a front face in contact with the adhesion layer 104. This makes it possible to obtain a photovoltaic module 101 that is flexible and foldable, for example.

Of course, everything that has been described in relation to the manufacturing method may be applied to the photovoltaic module, and vice versa.

The invention is industrially applicable to the manufacture of terrestrial and space photovoltaic modules as it makes it possible to encapsulate one or more III-V, silicon, or multi-junction photovoltaic cells. The invention may also make it possible to encapsulate thin-film photovoltaic cells such as, for example, GIGS (for copper, indium, gallium and selenium) photovoltaic cells, CdTe (for cadmium telluride) photovoltaic cells and OPVs (for organic photovoltaic cells).

The invention claimed is:

1. A method for manufacturing a photovoltaic module comprising at least one photovoltaic cell, the manufacturing method comprising a step of encapsulating the photovoltaic cell comprising the formation of a stack comprising:
    the photovoltaic cell,
    an encapsulation film based on a polymer material crosslinked at least at its gel point, and
    an adhesion layer based on a crosslinkable polymer material, the adhesion layer being configured to bond the encapsulation film to the photovoltaic cell,
    wherein the manufacturing method comprises:
    a crosslinking step comprising crosslinking of the crosslinkable polymer material of the adhesion layer, and
    a step of forming the adhesion layer on the encapsulation film before bringing the adhesion layer into contact with the photovoltaic cell.

2. The manufacturing method as claimed in claim 1, wherein the polymer material crosslinked at least at its gel point of the encapsulation film and the crosslinkable polymer material of the adhesion layer are respectively chosen from among the silicone family.

3. The manufacturing method as claimed in claim 1, wherein the encapsulation step comprises a step of laminating the stack implementing the crosslinking step.

4. The manufacturing method as claimed in claim 1, wherein:
    comprises forming the stack to have:
    a first part comprising said encapsulation film and said adhesion layer,
    a second part comprising an additional encapsulation film based on a polymer material crosslinked at least at its gel point and an additional adhesion layer based on a crosslinkable polymer material configured to bond the additional encapsulation film to the photovoltaic cell, and
    the photovoltaic cell interposed between the first and second parts, and
    the crosslinking step comprises crosslinking the crosslinkable polymer material of the additional adhesion layer and encapsulating the photovoltaic cell between the encapsulation film and the additional encapsulation film.

5. The manufacturing method as claimed in claim 4, wherein:
    the formation of the stack comprises forming the stack to have first and second protective elements between which the first and second parts of the stack are arranged, the first part of the stack comprising a bonding layer based on a crosslinkable polymer material configured to bond the encapsulation film to the first protective element, and the second part comprising an additional bonding layer based on a crosslinkable polymer material configured to bond the additional encapsulation film to the second protective element, and
    the crosslinking step comprises crosslinking the crosslinkable polymer material of the bonding layer and of the crosslinkable polymer material of the additional bonding layer and forming an encapsulation envelope for the photovoltaic cell bonded to the first and second protective elements.

6. The manufacturing method as claimed in claim 4, wherein the encapsulation film and the additional encapsulation film are perforated with holes such that within the stack:
    the adhesion and bonding layers are connected to one another at the holes in the encapsulation film, and
    the additional adhesion and bonding layers are connected to one another at the holes in the additional encapsulation film.

7. The manufacturing method as claimed in claim 3, wherein
    the formation of the stack comprises forming the stack to have first and second protective elements, and
    at least one of the first and second protective elements is deformable such that it undergoes a deformation during the lamination step.

8. The manufacturing method as claimed in claim 7, wherein after the lamination step, bonding a support to a deformed first protective element or to a deformed second protective element.

9. The manufacturing method as claimed in claim 1, wherein
    the formation of the stack comprises:
    a step of providing a flexible substrate comprising at least one portion impregnated with crosslinkable polymer material, and
    a step of bringing a back face of the photovoltaic cell into contact with the impregnated portion, the back face being opposite a front face of the photovoltaic cell, said front face being in contact with the adhesion layer within the stack, and
    the crosslinking step comprises crosslinking the crosslinkable polymer material impregnating the substrate resulting in the encapsulation of the photovoltaic cell.

10. The manufacturing method as claimed in claim 1, wherein a viscosity of the crosslinkable polymer material of the adhesion layer is strictly higher than 5 Pa·s at a temperature of 25° C. and lower than or equal to 50 Pa·s at a temperature of 25° C.

11. The manufacturing method as claimed in claim 1, wherein a viscosity of the crosslinkable polymer material of the adhesion layer is strictly higher than 5 Pa·s at a temperature of 25° C. and lower than or equal to 10 Pa·s at a temperature of 25° C.

12. The manufacturing method as claimed in claim 6, wherein the adhesion and bonding layers are connected to one another at the holes in the encapsulation film by crosslinkable polymer material present in said holes.

13. The manufacturing method as claimed in claim 6, wherein the additional adhesion and bonding layers are connected to one another at the holes in the additional encapsulation film by crosslinkable polymer material present in said holes.

* * * * *